United States Patent [19]

Williams et al.

[11] 3,776,737

[45] Dec. 4, 1973

[54] PHOTOSENSITIVE ELEMENT COMPRISING LIGHT-SENSITIVE POLYMERS

[75] Inventors: Jack L. R. Williams; Thomas M. Laakso; Douglas G. Borden, all of Rochester, N.Y.

[73] Assignee: Eastman Kodak Company, Rochester, N.Y.

[22] Filed: Aug. 5, 1971

[21] Appl. No.: 169,543

Related U.S. Application Data

[62] Division of Ser. No. 850,261, Aug. 14, 1969, abandoned.

[52] U.S. Cl. .................... 96/115 R, 96/35.1, 96/33, 204/159.14, 204/159.15, 260/47 EP

[51] Int. Cl. .......................... G03c 1/68, G03c 1/70

[58] Field of Search ................................ 96/115 R; 204/159.14, 159.19

[56] References Cited

UNITED STATES PATENTS

| | | | |
|---|---|---|---|
| 2,511,621 | 6/1950 | Condit | 260/75 |
| 2,498,533 | 2/1950 | Dimpfl | 260/45.4 |
| 3,615,434 | 10/1971 | McConkey et al. | 96/115 R |
| 3,615,628 | 10/1971 | Mench et al. | 96/115 R |

*Primary Examiner*—Ronald H. Smith
*Attorney*—Joshua G. Levitt

[57] ABSTRACT

A novel class of light-sensitive polymers contains recurring cyclohexadienedicarboxylate units as an integral part of, or appended to, a polymer backbone. The polymers, and photosensitive compositions and elements prepared therefrom, are utilized in the preparation of photomechanical images.

8 Claims, No Drawings

PHOTOSENSITIVE ELEMENT COMPRISING LIGHT-SENSITIVE POLYMERS

This is a division of my U.S. Pat. application Ser. No. 850,261 filed Aug. 14, 1969 for LIGHT-SENSITIVE POLYMERS, now abandoned.

This invention relates to photographic reproduction. In a particular aspect it relates to novel light-sensitive polymers and the use of such polymers in the preparation of photographic and photomechanical images.

It is known in the photographic art to reproduce images by processes which involve imagewise exposure of a layer of a radiation-sensitive material to modify the physical characteristics of the material in areas of the layer which have been exposed. Among the radiation-sensitive materials which have been used in such processes are light-sensitive polymers which are insolubilized or hardened on exposure to actinic radiation. The resulting difference in physical properties between exposed and unexposed areas can be employed to prepare images by such procedures as application of mechanical pressure, application of heat, treatment with solvents, and the like. Thus, the layer can be treated with a solvent for the unhardened polymer, which is a non-solvent for the hardened polymer, thereby removing unhardened polymer and leaving an image of hardened polymer. Alternatively, the layer can be heated to a temperature which is between the tackifying point of the material in unexposed areas of the layer and material in exposed areas of the layer so that the lower melting material can be toned with a colored powder or transferred to a receiving surface. Such processes have been employed to prepare lithographic printing plates, stencils, photoresists, and similar photographic and photomechanical images.

The different applications in which light-sensitive polymers are used require that such polymers be available with a variety of photographic and physical characteristics. Thus, there is a continual search for novel light-sensitive polymers.

It is an object of this invention to provide a novel class of light-sensitive polymers which can be efficiently sensitized to the visible region of the spectrum.

It is another object of this invention to provide a novel class of light-sensitive polymers which can be used in a variety of photographic and photothermographic reproduction processes.

It is a further object of this invention to provide photosensitive compositions and elements containing these novel light-sensitive polymers.

It is still a further object of this invention to provide processses for preparing photomechanical images employing these novel light-sensitive polymers.

The above and other objects of this invention will become apparent to those skilled in the art from the further description of the invention which follows.

We have found a novel class of light-sensitive polymers which contain the cyclohexadiene moiety. These polymers can be efficiently sensitized with sensitizers which absorb in the visible region of the spectrum and they have physical and photographic properties that make them desirable for use in a wide range of photographic and photothermographic image reproduction processes.

In accordance with this invention there is provided a novel class of light-sensitive, film-forming polymers containing recurring cyclohexadienedicarboxylate units. The recurring units either can be an integral part of the polymer backbone or they can be pendant therefrom. The polymers of this invention include polyesters prepared by the condensation of a cyclohexadienedicarboxylate with one or more diols, as well as polymers where the cyclohexadienedicarboxylate moiety is appended to a preformed polymer backbone containing reactive amino or hydroxyl groups.

In one embodiment of this invention the light-sensitive polymer is a polyester condensation product of a cyclohexadienedicarboxylic acid reactant, an organic diol reactant and, optionally, a different and modifying dicarboxylic acid reactant, and the polyester contains recurring units derived from a cyclohexadienedicarboxylate and recurring units derived from an organic diol. The polyester can be a homopolyester in which the cyclohexadienedicarboxylate reactant is the sole dicarboxylic acid reactant used to prepare the polyester, or it can be a copolyester prepared from one or more dicarboxylic acid reactants in addition to the cyclohexadienedicarboxylate reactant. Similarly, one or more organic diol reactants can be employed in the preparation of the polyesters of this invention. By the proper selection of bis-esters and diols, the physical properties of these polyesters can be varied from soft-rubbery to hard-glossy amorphous materials or crystalline materials, thus, making the polyesters useful in a variety of photographic and photothermographic image reproduction processes.

Typically, the polyesters are prepared by a polycondensation reaction between one or more diol reactants and one or more bis-esters of the dicarboxylic acid reactant or reactants. Useful catalysts for this reaction are titanium esters and alkoxides such as titanium isopropoxide, and tetraalkyltitanates, magnesium titanium esters, strontium oxide, zinc acetate, and the like.

The cyclohexadienedicarboxylate reactant can be a derivative of such cyclohexadienedicarboxylic acids as 1,3-cyclohexadiene-1,4-dicarboxylic acid, 1,3-cyclohexadiene-1,3-dicarboxylic acid, 1,3-cyclohexadiene-1,2-dicarboxylic acid, 1,5-cyclohexadiene-1,4-dicarboxylic acid, 1,5-cyclohexadiene-1,3-dicarboxylic acid, 2,4-cyclohexadiene-1,2-dicarboxylic acid, 2,6-cyclohexadiene-1,2-dicarboxylic acid, and alkylated and arylated derivatives of such dicarboxylic acids. Since those acids containing the carboxylic acid groups ortho to each other give polymers of relatively low molecular weight, the acids in which the carboxylic acid groups are para or meta to each other are preferred The acids in which the carboxylic acid groups are para to each other are especially preferred. Units derived from these cyclohexadienedicarboxylate reactants can be represented by the structural formula:

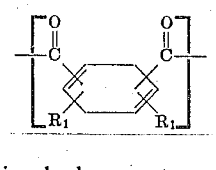

wherein each $R_1$ is a hydrogen atom, an alkyl group of one to 12 carbon atoms including straight and branched chain alkyl groups, e.g., methyl, ethyl, propyl, isopropyl, butyl, t-butyl, amyl, neopentyl, etc., including cycloalkyl groups, as well as alkyl groups substituted with such substituents as would not interfere with the condensation reaction such as halo, nitro, aryl, alkoxy, aryloxy, and the like; or aryl groups including mono and polynuclear, substituted or unsubstituted, aryl groups such as phenyl, naphthyl, chlorophenyl, nitrophenyl, ethoxyphenyl, etc.

The organic diol reactants which are condensed with the cyclohexadienedicarboxylate reactant to prepare the light-sensitive polyesters can be represented by the structural formula:

$$HO\text{-}R_2\text{-}OH$$

wherein $R_2$ is a divalent organic group having about two to 20 carbon atoms such as a divalent hydrocarbon group such as an aliphatic alkylene group (e.g., an ethylene group, a propylene group, an isopropylene group, a butylene group, a pentylene group, a hexylene group, a 2,2-dimethylpropylene group, a heptylene group, an octylene group, a 2-ethylhexylene group, a nonylene group, a decylene group, a dodecylene group, etc.) an arylene group (e.g., a phenylene group, a bisphenylene alkylene group, etc.), a cycloalkylene group, (e.g., a norbornylene group, a cyclohexylene group, a 1,4-dialkylene-cyclohexylene group, etc.); an ether group such as an alkylene-O-alkylene group, an alkylene-O-cyclohexylene-O-alkylene group, etc.; and the like.

Exemplary organic diols include ethylene glycol, diethylene glycol, 1,3-propanediol, 1,4-butanediol, 1,5-pentanediol, 1,6-hexanediol, 1,7-heptanediol, 1,8-octanediol, 1,9-nonanediol, 1,10-decanediol, 1,12-dodecanediol, neopentyl glycol, 2,2-bis-4-hydroxyphenylpropane, norbornanediol, 1,4-cyclohexanedimethanol, 1,4-di-$\beta$-hydroxyethoxycyclohexane, etc.

Recurring units derived from the organic diol reactant can be represented by the structural formula:

$$+O - R_2\text{-}O+$$

where $R_2$ is as defined above.

The light-sensitive polyesters of the present invention can contain, in addition to the recurring units derived from the cyclohexadienedicarboxylic acid, recurring units derived from one or more different and modifying dicarboxylic acids. The modifying dicarboxylic acid can be one which itself will give a light-sensitive polyester, such as a dicarboxylic acid containing the vinyl ketone group (e.g., p-phenylenediacrylic acid, fumaric acid, cinnamylidenemalonic acid, muconic acid, etc.), or it can be a non-light-sensitive dicarboxylic acid such a malonic acid, succinic acid, glutaric acid, adipic acid, pimelic acid, suberic acid, azelaic acid, sebacic acid, dodecanedioic acid, brassylic acid, $\alpha,\beta$-diethylsuccinic acid, $\alpha$-butyl-$\alpha$-ethyl glutaric acid, terephthalic acid, isophthalic acid, etc., as well as mixtures of such dicarboxylic acids.

When a modifying dicarboxylic acid is employed, the recurring units derived therefrom preferably constitute 25 to 75 percent of the carboxylate units in the polymer backbone; although when the modifying dicarboxylic acid is one which itself will give a light-sensitive polymer, the modifying dicarboxylate units can constitute up to 95 percent of the dicarboxylate units in the polyester.

Such recurring units can be represented by the structural formula:

$$\left[\begin{matrix} O & & O \\ \| & & \| \\ -C- & R_3 & -C- \end{matrix}\right]$$

wherein $R_3$ is a divalent saturated or unsaturated hydrocarbon group such as an alkylene group (e.g., methylene, ethylene, propylene, butylene, amylene, hexylene, heptylene, octylene, nonylene, decylene, undecylene, dodecylene, etc.), including substituted alkylene groups such as aralkylene groups (e.g., benzylidene, phenylethylene, phenylenedimethylene, etc.); an arylene group (e.g., phenylene, biphenylene, naphthylene, etc.), including substituted arylene groups such as alkarylene groups (e.g., methylphenylene, ethylphenylene, propylnaphthylene, etc.); an alkenylene group (e.g., vinylene, propenylene, butenylene, 1,3-butadienylene, hexenylene, 1,3-hexadienylene, 2,4-hexadienylene, etc.), including substituted alkenylene groups, such as aralkenylene groups (e.g., phenylenedivinylene), and an alkenylidene group (e.g., butenylidene), including substituted alkenylidene groups such as aralkenylidene groups (e.g., 1-phenyl-1,3-butadien-4-ylidene).

In a second embodiment of this invention, the light-sensitive polymer is one in which the half acid ester of a cyclohexadienedicarboxylic acid is appended through a carbonyl group to a polymer backbone containing a suitable reactive group.

The polymers which form the backbone of the light-sensitive polymers and to which the cyclohexadienedicarboxylate units are appended include natural and synthetic resins such as hydroxyl containing polymers, or example, poly(vinyl alcohol), poly(vinyl alcohol-co-vinyl acetate), poly(vinyl alcohol-co-vinyl benzoate), poly(vinyl alcohol-co-vinyl acetate-co-vinyl benzoate), polyethers such as epoxy and phenoxy polymers, e.g., the condensation product of a bisphenol, such as diphenylolpropane, with epichlorohydrin, naturally occurring materials such as cellulose, starch, guar, alginic acid, and their partially esterified or etherified derivatives, e.g., ethyl cellulose, hydroxyethyl cellulose, hydroxypropyl cellulose, polyesters of polyhydroxy intermediates such as glycerol and sorbitol which have hydroxyl groups remaining after incorporation in the polymer chain; polymers containing reactive amino groups, for example, poly(vinyl amines), aminostyrenes, and poly(vinyl anthranilates); and polymers containing reactive anhydride groups, for example, copolymers of maleic anhydride with ethylene or styrene.

The light-sensitive polymers of this embodiment are prepared by reaction of the hydroxy or amino group on the polymer backbone with a half acid halide-half ester of a cyclohexadienedicarboxylic acid. This reaction is typically carried out in a tertiary amine solvent such as pyridine, picoline, lutidine, triethylamine, and the like, at room temperature, or at elevated temperatures up to about 100° C.

When the hydroxyl containing polymer employed is a poly(vinyl alcohol), light-sensitive polymers which have good solubility and other desirable physical properties can be prepared by the procedure described in copending Reynolds U.S. Pat. application Ser. No. 812,380, entitled "A Process for the Preparation of Soluble Polyvinyl Esters" filed Apr. 1, 1969. This procedure involves swelling the poly(vinyl alcohol) in a tertiary amine solvent followed by partial esterification with an aroyl chloride such as benzoyl chloride. The partially aroylated poly(vinyl alcohol) is then esterified with the photosensitive acid chloride, after which any remaining hydroxyl groups optionally can be esterified with aroyl chloride.

Polymers of this embodiment have attached to the polymer backbone recurring units which can be represented by the structural formula:

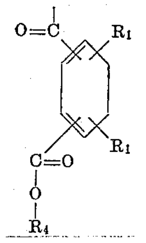

wherein $R_1$ is as defined above, and $R_4$ is a straight or branched chain alkyl group having about one to 20 carbon atoms, e.g., methyl, ethyl, propyl, isopropyl, butyl, sec-butyl, t-butyl, amyl, neopentyl, hexyl, heptyl, octyl, ethylhexyl, decyl, dodecyl, etc.

In addition to the cyclohexadienedicarboxylate group, the polymers of this embodiment can contain groups derived from other carboxylic and dicarboxylic acids attached to the polymer backbone. Such other groups are often used in modifying such physical properties of the polymer as solubility, adhesivity, melting point, and the like and in some instances can modify the sensitometric properties of the polymer as well. Useful groups include those derived from aliphatic and aromatic carboxylic acid, such as acetic acid, haloacetic acid, propionic acid, isovaleric acid, succinic acid, glutaric acid, adipic acid, sebacic acid, 2-ethylhexanoic acid, decanoic acid, benzoic acid, halobenzoic acids, nitrobenzoic acids, toluic acid, p-ethylbenzoic acid, p-octylbenzoic acid, p-ethoxybenzoic acid, p-amyloxy-benzoic acid, 2-naphthoic acid, and the like as well as those derived from carboxylic and dicarboxylic acids containing the vinyl ketone group such as cinnamic acid, halocinnamic acids, cinnamylideneacetic acid, cinnamylidenemalonic acid, p-phenylene-bisacrylic acid, and the like. The modifying groups can be attached to the polymer prior to addition of the cyclohexadienedicarboxylate group, for example, when an acetylated poly-vinyl alcohol) is used as the polymer backbone, or when the procedure of the Reynolds' application, referred to above, is employed to prepare the light-sensitive polymers of this invention. Alternatively, free reactive groups, which are contained on the polymer backbone after addition of the light-sensitive moiety, can be esterified with the acid chloride, or other suitable reactant, of these modifying groups. The modifying group can comprise up to 90% of the groups attached to the polymer backbone. Thus, as few as 10% of the groups pendant from the polymer backbone can be light-sensitive groups of the present invention. Preferably, 20 to 100% of the groups attached to the polymer backbone are light-sensitive groups of this invention.

Coating compositions containing the light-sensitive polymers of this invention can be prepared by dispersing or dissolving the polymer in a suitable organic solvent like alkanols, such as 2-methoxyethanol, etc.; ketones such as 2-butanone, 4-methyl-2-pentanone, cyclohexanone, 4-butyrolactone, 2,4-pentanedione, 2,5-hexanedione, etc.; esters such as 2-ethoxy-ethyl acetate, 2-methoxyethyl acetate, n-butylacetate, etc.; chlorinated hydrocarbon solvents such as chloroform, carbon tetrachloride, trichloroethylene, dichloroethane, trichloroethane, tetrachloroethane, etc.; as well as dimethylformamide and dimethyl sulfoxide; and mixtures of these solvents. Typically the light-sensitive polymer is employed in the coating composition in the range from about 1 to 20 percent by weight. Preferably the light-sensitive polymer comprises 2 to 10 percent by weight of the coating composition.

The coating compositions can include a variety of photographic addenda utilized for their known purpose, such as agents to modify the flexibility of the coating, agents to modify its surface characteristics, dyes and pigments to impart color to the coating, agents to modify the adhesivity of the coating to the support, and a variety of other addenda known to those skilled in the art.

The coating compositions can be sensitized with such sensitizers as pyrylium and thiapyrylium salts, thiazoles, benzothiazolines, naphthothiazolines, quinolizone, Michler's ketone, Michler's thioketone, and the like sensitizers. When a sensitizer is employed, it can be present in amounts of about 0.005 to 5 percent by weight of the coating composition.

The light-sensitive polymers of this invention can be the sole polymeric constitutent of the coating composition or another polymer can be incorporated therein to modify the physical properties of the composition and serve as a diluent. For example, phenolic resins, such as thermoplastic novolac resins, can be incorporated in the composition to improve the resistance of the polymer composition to etchants when it is used as a photoresist. Similarly, hydrophilic polymers such as cellulose and its derivatives, poly(alkylene oxides), poly(vinyl alcohol), and its derivatives, etc., can be incorporated in the composition to improve the hydrophilic properties of the coating when it is used in the preparation of lithographic printing plates. These other polymeric materials can constitute up to 25% by weight, based on the weight of the light-sensitive polymer of the coating composition.

Photosensitive elements can be prepared by coating the photosensitive compositions from solvents onto supports in accordance with usual practices. Suitable support materials include fiber base materials such as paper, polyethylene-coated paper, polypropylene-coated paper, parchment, cloth, etc.; sheets and foils of such metals as aluminum, copper, magnesium zinc, etc.; glass and glass coated with such metals as chromium, chromium alloys, steel, silver, gold, platinum etc.; synthetic polymeric materials such as poly(alkyl methacrylates), e.g., poly(methyl methacrylate), polyester film base, e.g., poly-(ethylene terephthalate), poly(vinyl acetals, polyamides, e.g., nylon, cellulose ester film base, e.g., cellulose nitrate, cellulose acetate, cellulose acetate propionate, cellulose acetate butyrate, and the like. The optimum coating thickness for a particular purpose will depend upon such factors as the use to which the coating will be put, the particular light-sensitive polymer employed, and the nature of other components which may be present in the coating. Typical coating thickness can be from about 0.1 to 10 mils.

Photomechanical images can be prepared with photosensitive elements by imagewise exposing the element to a light source to harden or insolubilize the polymer in exposed areas. Suitable light sources which can be employed in exposing the elements include sources rich in visible radiation and sources rich in ultraviolet radiation, such as carbon arc lamps, mercury vapor lamps, fluorescent lamps, tungsten lamps, photoflood lamps, and the like.

The exposed element can be developed with a solvent for the unexposed, uncrosslinked polymer which is a non-solvent for the exposed hardened polymer. Such solvents can be selected from the solvents listed above as suitable coating solvents as well as others.

In an alternate embodiment an image can be developed with the exposed elements by heating it to a temperature in the range of about 50° to 200° C., which is intermediate between the tackifying point of the polymer in unexposed and exposed areas, to soften or tackify the polymer in the unexposed areas. The softened polymer can then be toned or transferred to a receiving sheet under pressure and toned, or transferred without toning if a pigment, dye or color-forming compound is incorporated in the layer.

The following examples further illustrate this invention.

Example 1 Preparation of 1,4-Dimethoxycarbonyl-1,3-cyclohexadiene and 1,4-Dichloroformyl-1,3-cyclohexadiene One hundred and seventy-two grams (1 mole) of 1,4-cyclohexanedicarboxylic acid are heated under reflux with 500 g thionyl chloride until all solids are in solution. After 1 hour of additional heating under reflux, the hazy solution is filtered and the excess thionyl chloride removed by distillation. The residual oil is heated to 130° C. and treated with 331 g (2 moles) of bromine and is then heated for 2 hours under reflux. The stirred reaction mixture is purged with nitrogen and 140 ml of absolute methyl alcohol is added slowly while refluxing. After all the alcohol has been added, the mixture is refluxed for 3 hours and cooled to room temperature. The soft crystalline mass of the cooled reaction mixture is then added to a solution of 865 g of potassium hydroxide in 2 liters of ethyl alcohol with good stirring. Stirring is continued for 6 hours and then the flask is warmed in a hot water bath for 4 hours. Cold water is added to dissolve all the solids and the clear solution is acidified with concentrated hydrochloric acid. The precipitated crude acid which is separated by filtration is redissolved in a minimum quantity of aqueous potassium hydroxide solution. The acid is reprecipitated as before by adding concentrated hydrochloric acid. The air-dried acid (151 g ) is then mixed with an excess of thionyl chloride and the mixture heated under reflux for 6 hours. The excess of thionyl chloride is removed by distillation. The residue gives on distillation 1,3-cyclohexadiene-1,4-dicarboxylic acid chloride which melts at 55°–57° C.

Anal. Calcd, for $C_8H_6O_2Cl_2$: C, 46.9; H, 2.9; Cl, 34.6,
Found: C, 46.6: H, 3.1; Cl. 34.3.

The crude acid chloride is treated dropwise with a large excess of absolute methyl alcohol (400 ml). The resulting solution is heated for 3 hours at reflux. An additional 200 ml of methyl alcohol is added and the solution is heated with 10 g of decolorizing carbon. On cooling, the filtrate yielded 135 g of pure white 1,4-dimethoxycarbonyl-1,3-cyclohexadiene, m.p. 83°–84° C.

Anal. Calcd, for $C_{10}H_{12}O_4$: C, 61.2; H, 6.1,

Found: C, 61.3; H, 6.4.

Example 2 Preparation of Poly(1,9-nonylene 1,3-cyclohexadien-1,4-dicarboxylate)

Thirteen and eight-tenths grams (0.086 mole) of 1,9-nonanediol, 9.8 g (0.05 mole) of 1,4-dimethoxycarbonyl-1,3-cyclohexadiene are weighed into a 50 ml polymerization flask. The side arm of the flask is fitted with a cork and the flask itself fitted with a glass tube reaching the material in the flask such that helium gas could be bubbled through the reaction mixture during the first stage of heating. The flask is also fitted with an efficient Vigreux column for reflux return of high boiling material during this first heating stage, but such that the generated alcohols are distilled. The contents are melted by inserting the flask in a silicone oil bath held at 235° C. One drop (1/20 ml) of titanium isopropoxide is added to the melt and the flask and contents are heated under reflux for 3 hours for the first stage of the reaction. The Vigreux column, inert gas tube and the cork are removed and the side arm connected to a vacuum system in series with two dry ice-acetone traps. A stainless steel crescent shaped stirrer, fitted with a vacuum tight ball joint, is inserted into the reaction melt to stir the polymer. The pressure is gradually lowered to 0.08 mm Hg with stirring, at which pressure the polymer is stirred for 10 minutes for the second stage of the reaction. A crystalline, white polymer is obtained. The isolated polymer has an inherent viscosity of 0.87 as measured in 1:1 phenol/chlorobenzene. Another such run heated 2 hours during the first stage and 15 minutes in the second stage has an inherent viscosity of 0.52. A third such run heated 1 hour 35 minutes for the first stage and 10 minutes for the second stage has an inherent viscosity of 0.68.

Example 3 Preparation of Poly(1,5-pentylene 1,3-cyclohexadien-1,4-dicarboxylate)

Using the procedure described in Example 2, the following reactants are used to prepare a polyester: 8.9 g (0.086 mole) 1,5-pentanediol; 9.8 g (0.05 mole) 1,4-dimethoxycarbonyl-1,3-cyclohexadiene; and 1 drop of titanium isopropoxide. The first stage is run 1 hour and the second stage is run for 10 minutes under a vacuum of 0.08 mm Hg. The inherent viscosity in 1:1 phenol/-chlorobenzene is 0.44. The polymer is a light amber, noncrystalline, rubbery material.

Example 4 Preparation of Poly(trimethylene: 2,2-dimethyl-1,3-trimethylene azelate: 1,3-cyclohexadien-1,4-dicarboxylate)

Using the procedure described in Example 2 above, the following reactants are used to prepare a copolyester: 9.3 g (0.122 mole) 1,3-propanediol; 6.8 g (0.066 mole) neopentyl glycol; 15.0 g (0.05 mole) diisobutyl azelate; 9.8 g (0.05 mole) 1,4-dimethoxycarbonyl-1,3-cyclohexadiene; and 1 drop titanium isopropoxide. The first stage is run 2 hours, 10 minutes and the second stage is run 15 minutes under a vacuum of 0.08 mm Hg. The inherent viscosity in 1:1 phenol/chlorobenzene is 0.51. The polymer is a light amber noncrystalline solid.

Example 5 Preparation of Poly(trimethylene: 2,2-dimethyl-1,3-trimethylene sebacate: 1,3-cyclohexadien-1,4-dicarboxylate)

Using the procedure described in Example 2 above, the following reactants are used to prepare a copolyester:8.5 g (0.112 mole) 1,3-propanediol; 6.2 g (0.06 mole) neopentyl glycol; 15.7 g (0.05 mole) di-n-butyl sebacate; 9.8 g (0.05 mole) 1,4-dimethoxycarbonyl-1,3-cyclohexadiene; and 1 drop titanium isopropoxide.

The first stage is run 1 hour, 10 minutes and the second stage is run 15 minutes under a vacuum of 0.7 mm Hg. The inherent viscosity in 1:1 phenol/chlorobenzene is 0.65. The polymer is a light yellow, noncrystalline, tacky solid.

Example 6 Preparation of Poly(trimethylene: 2,2-dimethyl-1,3-trimethylene terephthalate: 1,3-cyclohexadien-1,4-dicarboxylate)

Using the procedure described in Example 2 above, the following reactants are used to prepare a copolyester: 8.5 g (0.112 mole) 1,3-propanediol; 6.2 g (0.06 mole) neopentyl glycol; 9.7 g (0.05 mole) dimethyl terephthalate; 9.8 g (0.05 mole) 1,4-dimethoxycarbonyl-1,3-cyclohexadiene; and 1 drop titanium isopropoxide. The first stage is run 2 hours and the second stage is run 25 minutes under a vacuum of 0.7 mm Hg. The inherent viscosity in 1:1 phenol/-chlorobenzene is 0.44. The polymer is a light yellow, noncrystalline solid.

Example 7 Preparation of Poly(nonylene terephthalate: 1,3-cyclohexadien-1,4-dicarboxylate)

Using the procedure described in Example 2 above, the following reactants are used to prepare a copolyester: 27.5 g (0.172 mole) 1,9-nonanediol; 9.7 g (0.05 mole) dimethyl terephthalate; 9.8 g (0.05 mole) 1,4-dimethoxycarbonyl-1,3-cyclohexadiene; and 1 drop titanium isopropoxide. The first stage is run 2 hours and the second stage is run 15 minutes under a vacuum of 0.8 mm Hg. The inherent viscosity in 1:1 phenol/-chlorobenzene is 0.65. The polymer is a white, crystalline solid, slightly rubbery, but friable.

Example 8 Preparation of Poly(trimethylene: 2,2-dimethyl-1,3-trimethylene 1,3-cyclohexadien-1,4-dicarboxylate: p-phenylene-diacrylate-azelate)

Using the procedure described in Example 2 above, the following reactants are used to prepare a copolyester: 21.3 g (0.28 mole) 1,3-propanediol; 15.6 g (0.15 mole) neopentyl glycol; 7.4 g (0.0375 mole) 1,4-dimethoxycarbonyl-1,3-cyclohexadiene; 17.1 g (0.0625 mole) diethyl p-phenylenediacrylate; 45.0 g (0.15 mole) diisobutyl azelate; and 3 drops titanium isopropoxide. The first stage is run 3 hours and the second stage is run 15 minutes under a vacuum of 0.7 mm Hg. The inherent viscosity in 1:1 phenol/chlorobenzene is 0.58. The polymer is a light, non-crystalline, slightly tacky, rubbery substance.

Example 9 Preparation of Poly(nonylene 1,3-cyclohexadien-1,4-dicarboxylate: p-phenylenediacrylate:azelate)

Using the procedure described in Example 2 above, the following reactants are used to prepare the copolyester: 68.8 g (0.43 mole) 1,9-nonanediol; 7.4 g (0.0375 mole) 1,4-dimethoxy-carbonyl-1,3-cyclohexadiene; 17.1 g (0.0675 mole) diethyl p-phenylenediacrylate; 45.6 g (0.15 mole) diisobutyl azelate; and 3 drops titanium isopropoxide. The first stage is run 2 hours and the second stage is run 12 minutes under a vacuum of about 0.8 mm Hg. The inherent viscosity in 1:1 phenol/chlorobenzene is 0.58. The polymer is a white, crystalline, waxy solid. Another such run heated 3 hours for the first stage and 10 minutes for the second stage yield a polymer having an inherent viscosity of 1.12.

Example 10 Preparation of Poly(ethylene 1,3-cyclohexadien-1,4-dicarboxylate:terephthalate:cinnamylidenemalonate)

Using the procedure described in Example 2 above, the following chemicals are used to prepare a copolyester: 21.3 g (6.34 mole) ethylene glycol; 4.0 g (0.02 mole) 1,4-dimethoxycarbonyl-1,3-cyclohexadiene; 13.6 (0.07 mole) dimethyl terephthalate; 30.1 g (0.11 mole)diethyl cinnamylidenemalonate and 1 drop titanium isopropoxide. The first stage is run 3 hours and the second stage is run 20 minutes under a vacuum of 0.1 mm Hg. The inherent viscosity in 1:1 phenol/-chlorobenzene is 0.22. The polymer is an amber, glassy solid.

Example 11 Preparation of Poly[-/-4,4'-isopropylidenebis(2,6-dichlorophenylene): 1,3-cyclohexadien-1,4-dicarboxylate] by an Interfacial Condensation Reaction Fourteen and twenty-five one hundredths grams (0.039 mole) of 2,2-bis(3,5-tetrachloro-4-hydroxyphenyl)propane are dissolved in a solution of 6.75 g (0.34 mole) sodium hydroxide in 140 ml of water. To the cool solution is then added 1 ml tri-isopentylamine and 140 ml 1,1,2,2-tetrachloroethane. At 18° C., there is added dropwise to the well stirred mixture, 8.75 g (0.042 mole) 1,4-dichloroformyl-1,3-cyclohexadiene in 20 ml 1,1,2,2-tetrachloroethane over a period of 10 minutes. After the addition is complete, the mixture is stirred for an additional 50 minutes. The reaction mixture is acidified with 20 ml of glacial acetic acid and the viscous organic layer is washed free of soluble materials with cold running water. The viscous organic layer is diluted with 50 ml of 1,1,2,2-tetrachloroethane and slowly poured into 2 liters of methyl alcohol. The white stringy polymer obtained by precipitation into methanol is leached in fresh methyl alcohol and dried at reduced pressure. The inherent viscosity of the polymer is 0.35 as measured in 1:1 phenol/chlorobenzene. A sample has the following analysis:

Anal. Calcd. for $C_{13}H_{16}Cl_4O_4$: C, 55.4; H, 3.2; Cl, 28.5,

Found: C, 55.2; H, 3.5; Cl, 25.8.

Example 12 Preparation of Poly(methyl-3,4-dichlorophenyl-4,4'-methylenediphenylene 1,3-cyclohexadien-1,4-dicarboxylate)

This polyester is prepared as described in Example 11 using the following reactants: 43.08 g (0.12 mole) 1,1-bis(4-hydroxyphenyl)-1-(3,4-dichlorophenyl)ethane; 25.00 g (0.122 mole) 1,4-chloroformyl-1,3-cyclohexadiene; 50 g (1.25 mole) sodium hydroxide; 250 ml water; 250 ml 1,1,2,2-tetrachloroethane; and 1 ml tri-n-amylamine. The product is a very light yellow polymer having an inherent viscosity of 0.41 in 1:1 phenol/chlorobenzene.

Anal. Calcd, for $C_{28}H_{20}O_4Cl_2$: C, 68.4; H, 4.0; Cl, 14.4,

Found: C, 67.8; H, 4.4; Cl, 13.8.

EXAMPLE 13 SENSITOMETRIC DATA

Solutions containing 2 percent of polymers prepared in the indicated example are coated and evaluated to give the sensitometric data in Table I. The photographic speed and spectral response of the polymers is determined by the procedure of L. M. Minsk et al. "Photosensitive Polymers, I & II" *Journal of Applied Polymer Science;* Vol. II, No. 6, pp, 302–311 (1959). The sensitivity value (SV) is a measure of the relative speed of the polymer, when exposed to ultraviolet or visible light, compared with the speed of unsensitized polyvinyl cinnamate as a standard. The symbol "λ max" indicates the upper limiting wavelength in mμ of effective crosslinking of polymer wedges prepared according to the referenced precedure. In all cases the lower limiting wavelength is 270 mμ. The coating and developing solvent employed is 1,2-dichloroethane. The sensitizers are added in two percent by weight based on the weight of the polymer, and are identified as follows:

A 2-benzoylmethylene-1-methyl-β-naphthothiazoline

B 2,6-bis(4-ethoxyphenyl)-4-(p-n-amyloxyphenyl)-thiapyrylium perchlorate

C 4,4'-bis(dimethylamino)benzophenone (Michler's ketone)

D methyl 3-methyl-2-benzothiazolinylidenedithioacetate

E 2-naphthyl phenyl ketone

F 4H-quinolizine-4-thione

G erythrosin

TABLE I.—SPEED AND SPECTRAL RESPONSE

| Polymer of Example— | | Sensitizer | | | | | | | |
|---|---|---|---|---|---|---|---|---|---|
| | | None | A | B | C | D | E | F | G |
| 2 (IV=0.52) | SV | 32 | 1,400 | 1,400 | | | | | |
| | λmax. | 360 | 450 | 580 | | | | | |
| 2 (IV=0.68) | SV | 110 | 710 | 890 | | | | | |
| | λmax. | 360 | 445 | 565 | | | | | |
| 3 | SV | 23 | 110 | 710 | 80 | 80 | | | |
| | λmax. | 350 | 440 | 570 | 470 | 470 | | | |
| 5 | SV | 22 | | | 130 | | 45 | | |
| | λmax. | 360 | | | 410 | | 360 | | |
| 6 | SV | 7 | | | 32 | | 22 | | |
| | λmax. | 360 | | | 390 | | 360 | | |
| 7 | SV | 63 | | | 130 | | 45 | | |
| | λmax. | 360 | | | 370 | | 380 | | |
| 9 (IV=1.12) | SV | 400 | | | 280 | | 400 | | |
| | λmax. | 360 | | | 410 | | 400 | | |
| 9 (IV=0.58) | SV | 32 | | | 63 | | 45 | | |
| | λmax. | 360 | | | 410 | | 370 | | |
| 12 | SV | 14 | 22 | | 17 | 22 | | 16 | 22 |
| | λmax. | 360 | 440 | | 420 | 440 | | 400 | 500 |

Example 14 Preparation of 1-Methoxycarbonyl-4-chloroformyl-1,3-cyclohexadiene

One hundred and twenty-five grams (0.61 mole) of 1,4-dimethoxycarbonyl-1,3-cyclohexadiene is dissolved in a minimum of methyl alcohol. To this solution is added 34 g (0.61 mole) of potassium hydroxide in a minimum of methyl alcohol. Both solutions are combined at 50° C. with good stirring then allowed to react for 15 minutes, after which time an equal volume of cold water is added. The cold solution is acidified. The crude white half-ester acid is immediately separated by filtration and washed on the funnel with distilled water. The dry crude acid is crystallized from benzene to give an 85 percent yield of the half-ester acid, m.p. 179°–181° C.

Anal. Calcd, for $C_9H_{10}O_4$: C, 59.3; H, 5.5,

Found: C, 59.4; H, 5.8.

The recrystallized half-ester acid is then heated under reflux with an excess of thionyl chloride for 3 hours. The excess thionyl chloride is removed by distillation and the residual crystalline mass is distilled at 81° C.(165μ). The resulting clear, colorless distillate when crystallized melts at 72°–73° C. (90 percent yield) and has the following analysis.

Anal. Calcd, for $C_9H_9O_3$ Cl: C, 53.4; H, 4.5; Cl, 17.5,

Found: C, 53.7; H, 4.5; Cl, 17.9.

Example 15 Preparation of Poly(vinyl acetate-co-vinyl benzoate-covinyl 1-methoxycarbonyl-1,3-cyclohexadien-4-carboxylate)

Two grams of a medium molecular weight poly(vinyl alcohol) containing 12 percent residual acetate groups (Elvanol 52-22 DuPont) is heated at 70° C. for 18 hours with 75 g of anhydrous pyridine. To the cooled mixture there is then added 2 ml of benzoyl chloride and the whole is heated 1 hour on a steam bath at 50° C. Four and six-tenths grams of 1-methoxy-carbonyl-4-chloroformyl-1,3-cyclohexadiene is then added and heating is continued an additional 3 hours until all the solids have gone into solution. The pyridine solution is then poured slowly into 1 liter of methanol. The precipitated polymer is leached sequentially in fresh methanol and several changes of distilled water. The polymer is dried in vacuum over phosphoric anhydride at room temperature. The yield is 6.0 g.

Anal. Calcd. for 50 percent material: C, 66.35; H, 5.7,

Found: C, 65.2; 65.6; H, 5.2; 5.3.

Example 16 Preparation of Poly(vinyl acetate-co-vinyl benzoate-co-vinyl cinnamate-co-vinyl 1-methoxycarbonyl-1,3-cyclohexadien-4-carboxylate Two grams (0.0454 mole) of the medium molecular weight poly(vinyl alcohol) used in Example 15 is warmed at 70° C. for 12 hours in 75 ml of pyridine. The swollen polymer is treated with 2 ml (3.2 g, 0.0227 mole) of benzoyl chloride and, with occasional stirring, is heated for 1.5 hours at 50° C. One and nine-tenths grams (0.01135 mole) of cinnamoyl chloride and 2.3 g (0.01135 mole) of 1-chloroformyl-4-methoxycarbonyl-1,2-cyclohexadiene is added all at once. This mixture is heated at 50° C. for 4.5 hours in total darkness with occasional stirring. The clear, dark amber solution is carefully decanted into 1 liter of methyl alcohol to precipitate the polymer from solution. After leaching in several changes of methanol and then distilled water, the light-sensitive polymer is dried over phosphoric anhydride at reduced pressure in total darkness. The yield of product is 5 g.

Anal. Found: C, 69.8 percent; H, 6.1 percent.

EXAMPLE 17 SENSITOMETRIC DATA

The polymers prepared in Examples 15 and 16 are evaluated for photographic speed and spectral response by the procedure identified in Example 13. The coating and developing solvent employed is 1,2-dichloroethane. For the polymer of Example 16 5% methanol is added to the coating solvent. The sensitizers are as identified in Example 13. The results are as follows:

TABLE II.—SPEED AND SPECTRAL RESPONSE

| Polymer of Example— | | Sensitizer | | | |
|---|---|---|---|---|---|
| | | None | A | B | F |
| 15 | SV | 2,500 | 11,000 | 36,000 | 16,000 |
| | λmax. | 370 | 460 | 580 | 490 |
| 16 | SV | 71 | 560 | 1,300 | 1,800 |
| | λmax. | 370 | 450 | 560 | 590 |

Example 18 Preparation of Lighographic Printing Plates

Ten grams of the crude polyester prepared in Example 2 is dissolved in tetrachloroethane and filtered through glass wool. The solution is then poured into methanol and the reprecipitated polymer is slurried twice in fresh methanol and dried. A 4 percent solution of the polyester in 1,2-dichloroethane is prepared and this solution is whirl-coated on five grained aluminum plates with the addition of ½ percent of one of the following sensitizers to one each of the plates: a. none, b. 2,6-bis(p-ethoxyphenyl)-4-(p-n-amyloxyphenyl)- thiapyrylium perchlorate, c. 1-methyl-2-benzoylmethylene-β-naphthothiazoline, d. 2,6-bis(4-azidobenzylidene)-4-methylcylohexanone, and e. benzophenone. The five plates are exposed through a photographic line and half-tone negative to a medium pressure mercury vapor lamp on the Ozalid "Ozamatic" machine for 10 seconds. The plates are rinsed in dichloroethane and subsequently etched with a desensitizing etch and inked with a greasy lithographic ink to form negative-working lithographic printing plates. The sensitivity of plates (b) and (c) is such that they could be exposed for a much shorter exposure to the mercury lamp or to a less intense source of ultraviolet radiation.

Example 19 Preparation of a Photoresist Coating

A 4 percent solution in 1,2-dichloroethane of the polymer described in the preceding example is made and 1 percent of 2,6-bis(4-azidobenzylidene)-4-methylcyclohexanone is added. The composition is whirl-coated on a 1.5 mil copper-clad circuit-board and dried. The coating is exposed through a line and half-tone negative to a xenon source at a setting of 150 units in a Model FT 261 "Flip-Top Platemaker" sold by the NuArc Company, Chicago, Ill. There is a bright red-orange print-out image in the exposed areas. The plate is developed in 1,2-dichloroethane and then dried at 50° C. for 1 hour. It is then etched in 42° C. Baume ferric chloride at room temperature until etching of the copper is completed. The polyester constitutes an excellent photoresist permitting complete removal of the copper in the non-image areas with protection of the copper in the image areas.

The invention has been described in detail with particular reference to preferred embodiments thereof, but it will be understood that variations and modifications can be effected within the spirit and scope of the invention.

What is claimed is:

1. A photosensitive element comprising a support and a light-sensitive layer located on said support comprised of a light-sensitive, linear, film-forming polymer consisting essentially of recurring units containing hydroxyl or amino reactive groups at least a portion of which have been reacted with at least one carboxylic acid including the half acid ester of cyclohexadiene-1,4-dicarboxylic acid to form recurring light-sensitive appending units.

2. A photosensitive element according to claim 1 wherein said light-sensitive appending units have the structural formula:

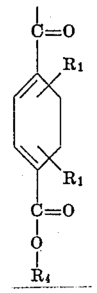

wherein $R_1$ is selected from the group consisting of hydrogen atoms, alkyl groups having one to 12 carbon atoms and aryl groups, and $R_4$ is an alkyl group having one to 20 carbon atoms.

3. A photosensitive element as defined in claim 1 wherein said polymer is derived from poly(vinyl alcohol).

4. A photosensitive element as defined in claim 1 wherein said polymer is a polyether derived from the condensation product of a bisphenol with epichlorohydrin.

5. A photosensitive element as defined by claim 1 in which said carboxylic acid includes a carboxylic acid containing a vinyl ketone group.

6. A photosensitive element as defined by claim 1 in which said carboxylic acid includes a modifying carboxylic acid selected from the group consisting of acetic acid, benzoic acid, and cinnamic acid.

7. A photosensitive element which comprises a support bearing a layer of a light-sensitive, linear, film forming polymer consisting essentially of poly(vinyl acetate-covinyl benzoate-co-vinyl 1-methoxycarbonyl-1,3-cyclohexadiene-4-carboxylate).

8. A photosensitive element which comprises a support bearing a layer of a light-sensitive, linear film forming polymer consisting essentially of poly(vinyl acetate-covinyl benzoate-co-vinyl cinnamate-co-vinyl 1-methoxycarbonyl-1,-3-cyclohexadiene-4-carboxylate).

* * * * *